United States Patent [19]

Feist

[11] Patent Number: 4,569,698

[45] Date of Patent: Feb. 11, 1986

[54] METHOD OF FORMING ISOLATED DEVICE REGIONS BY SELECTIVE SUCCESSIVE ETCHING OF COMPOSITE MASKING LAYERS AND SEMICONDUCTOR MATERIAL PRIOR TO ION IMPLANTATION

[75] Inventor: Wolfgang M. Feist, Burlington, Mass.

[73] Assignee: Raytheon Company, Lexington, Mass.

[21] Appl. No.: 739,509

[22] Filed: May 31, 1985

Related U.S. Application Data

[63] Continuation of Ser. No. 602,274, Apr. 24, 1984, abandoned, which is a continuation of Ser. No. 352,439, Feb. 25, 1982, abandoned.

[51] Int. Cl.$^4$ .................. H01L 29/78; H01L 21/265; H01L 21/31
[52] U.S. Cl. ........................................ 148/1.5; 29/571; 29/576 B; 29/579; 148/187; 156/643; 156/657; 357/50; 357/91
[58] Field of Search ...................... 29/571, 576 B, 579; 148/1.5, 187; 357/50, 91; 156/643, 657

[56] References Cited

U.S. PATENT DOCUMENTS

| | | | |
|---|---|---|---|
| 3,783,047 | 1/1974 | Paffen | 148/187 |
| 4,084,987 | 4/1978 | Godber | 148/1.5 |
| 4,157,269 | 6/1979 | Ning et al. | 148/1.5 |
| 4,187,125 | 2/1980 | Feist | 148/1.5 |
| 4,261,763 | 4/1981 | Kumar et al. | 148/1.5 |
| 4,318,751 | 3/1982 | Horng | 148/1.5 |
| 4,351,099 | 9/1982 | Takagi et al. | 29/571 |
| 4,372,030 | 2/1983 | Saitoh | 29/569 R |
| 4,373,965 | 2/1983 | Smigelki | 148/1.5 |
| 4,374,698 | 2/1983 | Sanders et al. | 156/643 |
| 4,412,378 | 11/1983 | Shinada | 29/578 |
| 4,418,470 | 12/1983 | Naster et al. | 29/577 C |

FOREIGN PATENT DOCUMENTS

| | | |
|---|---|---|
| 48175 | 3/1982 | European Pat. Off. |
| 1545208 | 5/1979 | United Kingdom |
| 2021859 | 12/1979 | United Kingdom |
| 1587398 | 4/1981 | United Kingdom |

OTHER PUBLICATIONS

Gaylon, G. T., IBM-TDB, 18 (1975), 1854.
Ozawa et al., IEEE-Trans. Electron Devices ED-25 (1978), 56–57.
Rideout et al., IBM-TDB, 17 (1974), 949.

Primary Examiner—Upendra Roy
Attorney, Agent, or Firm—Richard M. Sharkansky

[57] ABSTRACT

A method for forming isolation regions in a semiconductor structure is provided. A mask comprising an upper and a lower layer of different materials is provided over the surface of the structure. A window is formed in the upper layer over the portions of the structure wherein the isolation regions are to be provided. Using the window in the upper layer as a mask, a larger window is formed in the lower layer by bringing a chemical etchant which etches only the lower layer into contact with the portions of the lower layer exposed by the window in the upper layer. The larger window formed in the lower layer is used as an etching mask to form an isolation groove, or depression, in the underlying semiconductor structure. The upper layer having the smaller window is used as an ion implantation mask for implanting particles into the bottom portion of the groove while masking the side portions of the grooves from the ions. With such method, lateral oxidation regions having self-registered anti-inversion regions which are located under the bottoms of the isolation regions and are spaced from the peripheries of the isolation regions by uniform, predetermined distances are obtained.

8 Claims, 22 Drawing Figures

METHOD OF FORMING ISOLATED DEVICE REGIONS BY SELECTIVE SUCCESSIVE ETCHING OF COMPOSITE MASKING LAYERS AND SEMICONDUCTOR MATERIAL PRIOR TO ION IMPLANTATION

This application is a continuation of application Ser. No. 602,274, filed Apr. 24, 1984, now abandoned, which is a continuation of Ser. No. 352,439, filed Feb. 25, 1982, now abandoned.

BACKGROUND OF THE INVENTION

This invention relates generally to semiconductor structure manufacturing methods and more particularly to methods used for providing isolated regions within semiconductor structures.

As is known in the art, it has been suggested that bipolar and metal oxide semiconductor (MOS) monolithic integrated circuit chips, or semiconductor structures, use oxide or dielectric isolation, as distinguished from junction isolation, to provide electrical isolation between devices formed in such chips. The main advantages offered by oxide isolation, namely lower parasitic circuit capacitance and potentially greater packing density, result in faster circuits of greater computing power on a given chip size than can typically be achieved using junction isolation.

A variety of methods have been suggested to provide oxide isolation in silicon structures. Common to such methods is the use of a composite silicon dioxide-silicon nitride layer used as a mask for selective oxidation of the exposed surfaces of a silicon structure. The thermally grown or deposited silicon dioxide layer (400–2500Å thick) is formed under a later deposited silicon nitride (500–2000Å) layer. The silicon dioxide layer is used as a buffer layer to absorb some of the stresses developing between the silicon nitride and the silicon substrate due to mismatch of their thermal expansion. To fabricate the oxide isolation, windows are first etched by conventional photolithography and wet or plasma etching into the composite silicon dioxide-silicon nitride layer to delineate the regions where the isolation regions are to be formed. Next, the exposed silicon substrate is etched by isotropic or anisotropic etching to a depth approximating one-half the thickness of the desired silicon dioxide isolation (typically 3000–20,000Å) so that a nearly planar surface is obtained after the step that follows, namely thermal oxidation of the exposed silicon. The nearly planar surface results because about twice as much silicon dioxide is formed as silicon consumed in the oxidation process. One may omit the silicon etching step if a topography where about one-half of the thickness of the oxide isolation rises above the original substrate surface can be tolerated. After the oxidation, the silicon dioxide-nitride masking layer, or nitride part alone, may be stripped and devices such as transistors, resistors, and diffused interconnects may be formed in the islands that were defined by the silicon nitride mask.

While this scheme of forming lateral oxide isolation is generally satisfactory for forming oxide isolation regions in p-type silicon epitaxial layers which are formed on n-type silicon substrates, it needs to be modified for forming isolation regions in n-type epitaxial layers formed on p-type silicon substrates due to the positive charges that always reside in silicon dioxide on silicon, although in various amounts (depending on the processing conditions). If the substrate doping is less than $10^{17}$ atoms/cm$^3$ as is usually the case, the positive oxide charge may lead to an electrical inversion of the surface of the p-substrate, which thus becomes n-type. This so called n-type channel electrically connects the n-regions of the circuit components with each other which otherwise would have been isolated from each other by the oxide isolation in the lateral direction, and by a reverse biased p-n junction in the vertical direction. In addition to charges in the oxide, interconnects crossing the oxide isolation can induce inversion in substrates of both n or p type polarities, depending on the sign and magnitude of their electrical potential.

In order to prevent loss of isolation by inversion, one usually enhances the substrate doping in a shallow region under the oxide isolation. This can be done using the following methods: Method (1)—the additional doping is selectively introduced into the substrate surface by thermal diffusion or ion implantation. An epitaxial layer is then deposited in which oxide isolation regions are formed, as described above, registered with the enhanced doping pattern; Method (2)—after forming the oxide-nitride mask for selective oxidation, the exposed substrate surface is selectively implanted, or thermally diffused with the anti-inversion layer before the isolation oxide is grown over the same regions. The surface is etched back before the doping takes place if a nearly planar surface after oxidation is desired; Method (3)—this is a modification of method (2) and uses a self-aligned positioning of the enhanced doping under the bottom of the oxide isolation while the sidewalls of the oxide isolation are shielded against it. This is accomplished by creating a mask overhang by etching into the substrate with isotropic or a combined anisotropic-isotropic etch, and then implanting the dopant using the overhang as a shield as described in my U.S. Pat. No. 4,187,125 issued Feb. 5, 1980 and assigned to the same assignee as the present invention.

Due to elimination of registration difficulties, methods (2) and (3) have particular appeal for highly integrated circuits because of their small feature sizes. However, with epitaxial layers and oxide isolation getting shallower (less than 2 micro-meters) in order to obtain faster and smaller circuits, a problem with small breakdown voltages and relatively large parasitic capacitances arises due to the narrow spacing between the heavily doped source and drain regions of MOS transistors, or base region of bipolar transistors, and the rather heavily doped anti-inversion zone. While method (3) significantly alleviates this problem, the spacing it provides may not be large enough for some applications such as PROM's, A/D converters or buffer stages where relatively large breakdown voltages (e.g. 15–50 volts) are often required.

SUMMARY OF THE INVENTION

In accordance with the present invention, a method for forming isolation regions in a semiconductor structure is provided. A mask comprising an upper layer and a lower layer of different materials is provided over the surface of the structure. A window is formed in the upper layer over the portions of the structure wherein the isolation regions are to be provided. Using the window in the upper layer as a mask, a larger window is formed in the lower layer by bringing a chemical etchant which etches only the lower layer into contact with the portions of the lower layer exposed by the window in the upper layer. The larger window formed in the lower layer is used as an etching mask to form an isolation groove, or depression, in the underlying semiconductor structure. The upper layer having the smaller window is used as an ion implantation mask for implanting particles into the bottom portion of the groove while masking the side portions of the grooves from the ions.

With such method, lateral oxidation regions having a self-registered anti-inversion region are located under the bottoms of the isolation regions and are spaced from the peripheries of the isolation regions by uniform, predetermined distances. When planarity is not a concern, the above method can be used without etching a groove in the underlying semiconductor.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENTS

Figure 1:
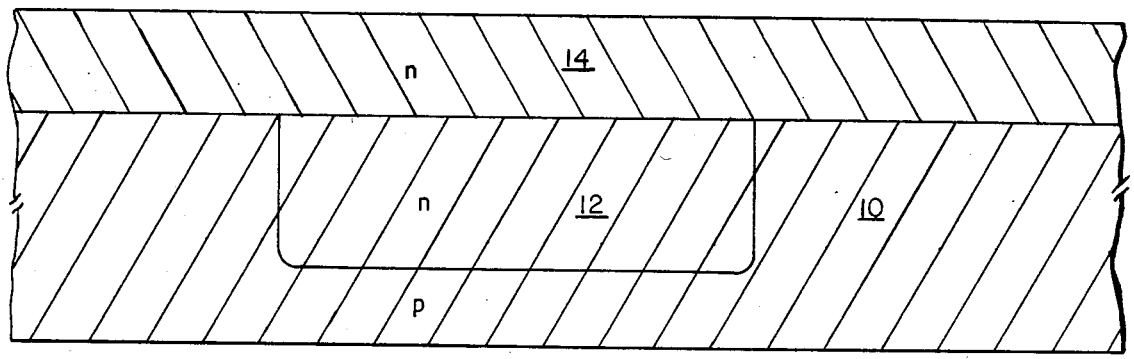
FIGS. 1 through 12, and 14 through 17 are cross-sectional elevation views of a portion of a bipolar transistor according to the invention at various steps in the manufacture thereof.

Referring now to FIG. 1, a substrate 10, here p-type silicon, having a surface in the <100> crystallographic plane and a resistivity of 10 to 40 ohm-cm is shown having an n-type conductivity subcollector region 12 formed therein using any conventional process, here ion implanting arsenic (or antimony) through a silicon dioxide or photoresist mask (not shown). Alternatively, such subcollector region 12 may be formed by diffusion. After stripping the silicon dioxide or photoresist mask by conventional techniques, an epitaxial layer 14 of n-type conductivity silicon is grown. Such epitaxial layer 14 is here grown to a thickness of 1.5 to 3 micrometers.

Figure 2:
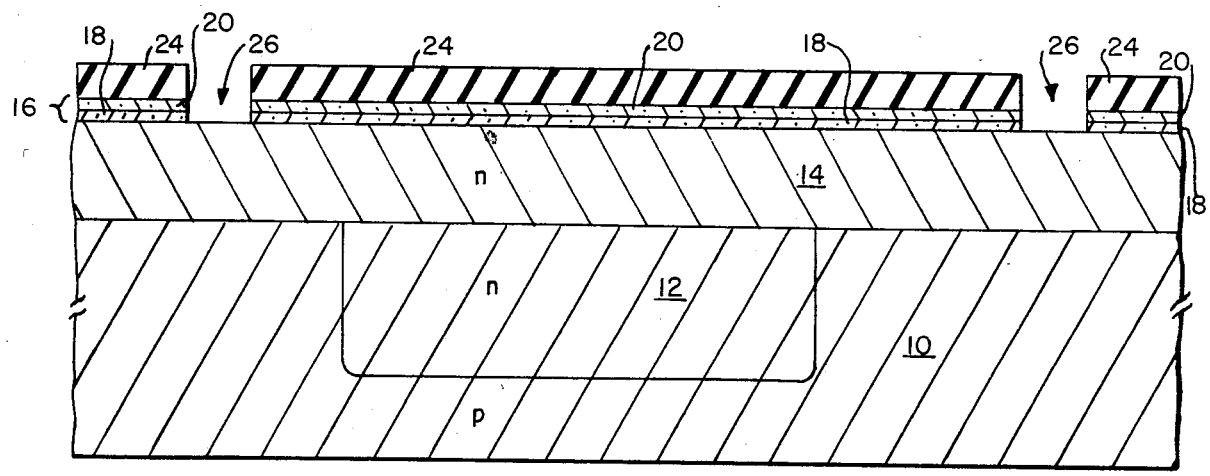
Figure 2A:
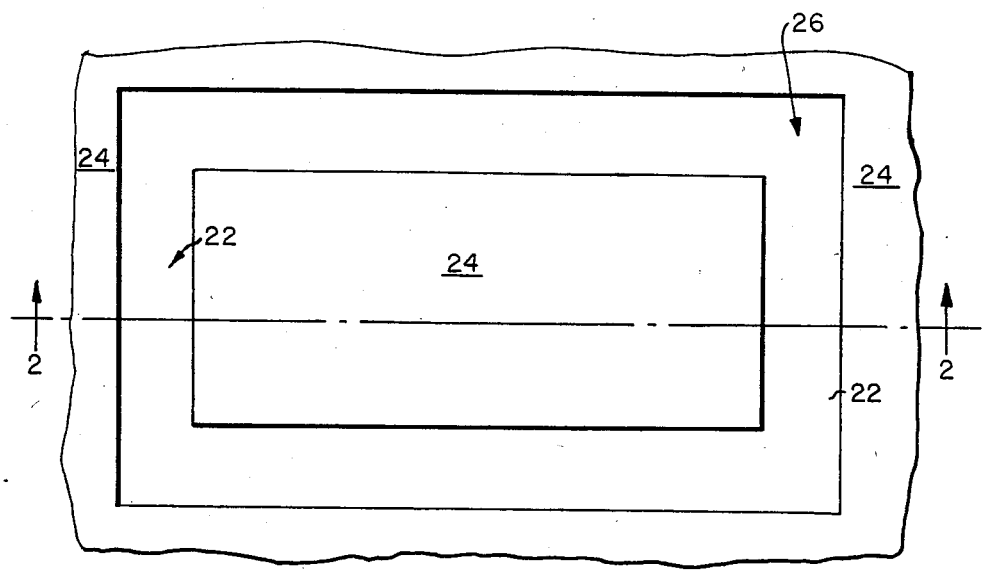
FIG. 2A is a plan view of the bipolar transistor at one step in the fabrication thereof, FIG. 2 being a cross-sectional elevation view taken along line 2—2 of FIG. 2A.
Figure 3:
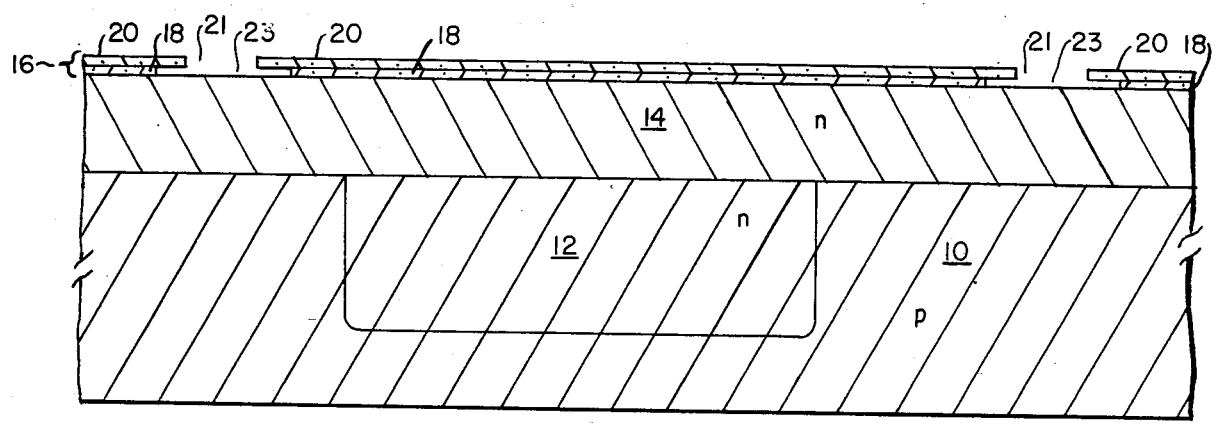

Referring to FIGS. 2 and 2A, a composite layer 16 is formed over the surface of the epitaxial layer 14. In particular, such composite layer 16 includes: a layer 18 of silicon dioxide, here thermally grown or chemically vapor deposited over the surface of the epitaxial layer 14 to a thickness of 500 to 3000 Angstroms (Å); and, a silicon nitride layer 20 deposited, here chemically vapor deposited over the surface of the silicon dioxide layer 18, here to a thickness of 1500Å. A layer 24 of photoresist is deposited over the composite layer 16 and is patterned into an isolation mask using conventional photolithographic-chemical etching techniques to form windows 26, as shown. Preferably, the widths of such isolation windows 26 are as small as practical, here in the order of 2 micrometers. Using the patterned photoresist layer 20 as a mask, the composite layer 16 is selectively etched away as shown. For example, here the exposed portions of the silicon nitride layer 20 are removed using conventional plasma etching forming windows 21 (FIG. 3) and then exposed portions of the silicon dioxide layer 18 are removed by using a suitable chemical etchant, here a hydrofluoric acid solution or also by plasma etching forming larger sized windows 23. In any event, it is noted that the etchant used to etch the silicon dioxide layer 18 is selective; that is, such etchant is selectively etching silicon dioxide layer 18 without attacking either silicon, silicon nitride, or photoresist. The silicon dioxide etching process continues so that the silicon dioxide layer 18 undercuts the etched silicon nitride layer as shown in FIG. 3. The amount of undercutting is controlled by controlling the length of time of the silicon dioxide chemical etching process. Here the amount of undercutting is about 1 micrometer. The photoresist layer 24 is then removed in any conventional manner.

Figure 4:
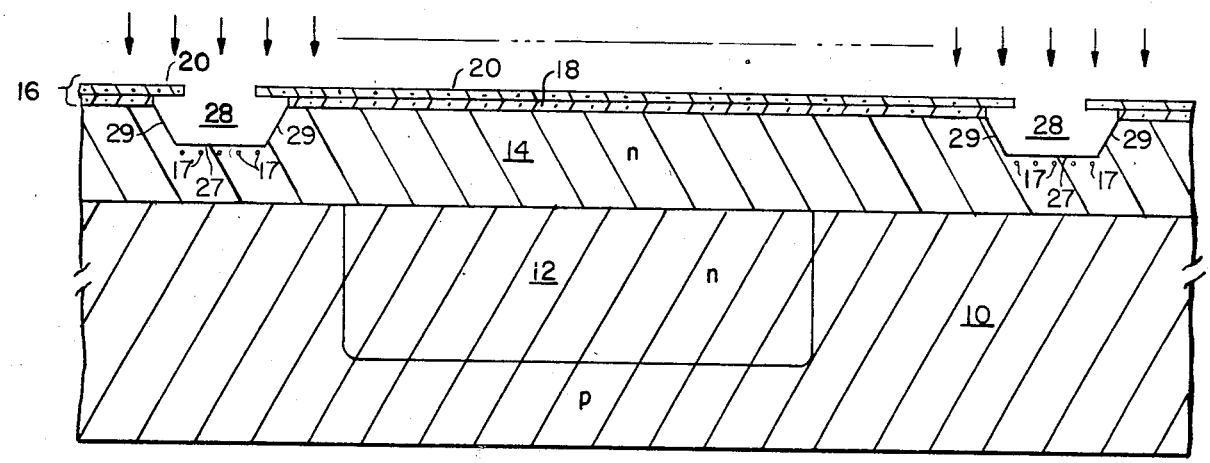

The remaining portions of the etched composite layer 16 are used to provide a mask for etching a depression, or an isolation groove 28 in the epitaxial layer 14, as shown in FIG. 4, here with an anisotropic etchant. If a nearly planar structure is desired and the epitaxial layer 14 is no more than 3 micrometers thick, the isolation grooves 28 are etched to a depth of 5000Å to 10,000Å using a conventional anisotropic etchant such as a potassium hydroxide solution. For a thicker epitaxial layer 14, i.e. 3.5 to 4 micrometers, the etching is carried to a depth of 1.6 to 2 micrometers using a combination etching technique. That is, first 0.3 micrometers to 0.5 micrometers of the silicon epitaxial layer 14 is etched using an anisotropic etchant and the remaining 1.3 to 1.7 micrometers of the epitaxial layer 14 are selectively removed using an isotropic etchant. This latter method yields isolation grooves with sloped side walls if it is not practical to backfill the entire isolation groove with thermally grown silicon dioxide upon which metallization will be formed as described in my U.S. Pat. No. 4,187,125 issued Feb. 5, 1980 and assigned to the same assignee as the present invention. Since the anisotropic etch preferably attacks along the <100> crystallographic axis, a silicon substrate 10 (FIG. 1) having a surface in the <100> crystallographic plane is required in such method with the isolation groove patterns to be etched aligned along the <110> crystallographic axes.

Referring again to FIG. 4, here an anisotropic etchant is used to form the isolation groove 28, as shown. During the etching with the anisotropic etchant portions of the silicon epitaxial layer 14 under the composite layer 16 are removed, such composite layer 16 providing the etch resistant mask for the anisotropic etchant, as shown. That is, during the anisotropic etching process, the silicon nitride layer 20 overhangs the side walls 29 of the isolation groove 28 formed in the epitaxial layer 14. It should be noted that the etching mask is here provided by the silicon dioxide layer 18. The surface of the structure thus formed and shown in FIG. 4 is next subjected to an ion implantation process. In particular, the surface of the structure thus formed is exposed to boron ions 17 (or other particles capable of providing a p-type conductivity region in the n-type conductivity epitaxial layer 14). Here the ion implantation dosage is: $1.5 \times 10^{14}/cm^2$ at 30 Kev so that the range of peak concentration of the implantation is at a depth from the surface of the exposed epitaxial layer 14 in the order of 1000Å. It is noted that the overhang portion of the silicon nitride 20 shields the side walls 29 of the isolation grooves 28 from the boron ions and thus provides the ion implantation mask and the boron ions 17 are implanted only in the bottom portion 27 of the groove 28. As noted above, the chemical etching mask used to form the isolation grooves 28 was provided by silicon dioxide layer 18. Further, it is noted that the aperture or window formed in layer 18 was larger than that formed in layer 20. Thus, the resulting side wall portions of groove 28 have a wider span than that which would have resulted if the window in layer 18 was the same as the window in layer 20. In this way, the self-registered anti-inversion region to be formed from the implanted ions 17 have adequate separation from the side wall portions of the grooves 28. It is also noted that the isolation grooves 28 will be thermally oxidized to fill such grooves in a manner to be described to provide a substantially planar surface for metallization which passes over the surface of the structure, and over the filled grooves to electrically interconnect devices formed in the structure and that a significant portion of the boron implantation will diffuse into the epitaxial layer. In this way, the oxidation of the silicon of epitaxial layer 14, in the manner to be described, does not remove substantial amounts of the boron dopant and the final structure has a proper boron, p-type conductivity, in the region of the epitaxial layer 14 beneath the bottom portion of the groove 28 to provide a structure with minimum inversion possibility.

Figure 5:
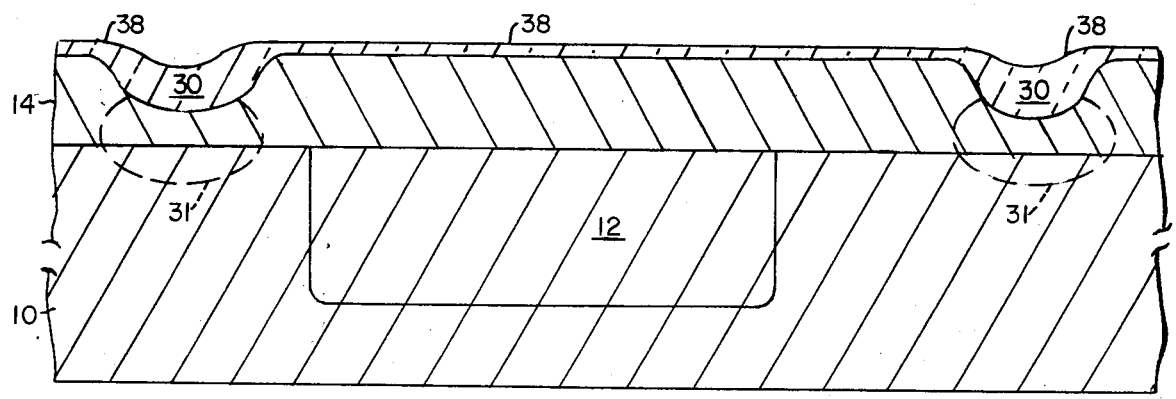

After an anneal at 1000° C. for 20 minutes in an argon atmosphere, the structure thus formed is placed in an oxidizing atmosphere so that a layer 30 of silicon dioxide is thermally grown selectively over the exposed portions of the silicon epitaxial layer 14, as shown in FIG. 5. In particular, the isolation grooves 28 (FIG. 4) are selectively oxidized in a clean, wet $O_2$ atmosphere (with HCl added) to grow a layer 30 (FIG. 5) of silicon dioxide 1.2 micrometers to 1.5 micrometers thick. Typically, the oxidation cycle lasts for 8 hours at 1000° C. During this oxidation (and later heating cycles to be described) portions of the implanted boron particles diffuse through the silicon epitaxial layer 14 into the substrate 10 to form a doped region 31, as shown in FIG. 5. With an initial isolation groove depth of 8000Å and growing a 1.5 micrometer thick silicon dioxide layer 30, for example, the boron region 31 cuts through the remainder of a 3 micrometer thick epitaxial layer 14 into the substrate 10 to provide the desired isolation region, as shown. For a thicker epitaxial layer 14, one may use additional up-diffusion of boron placed into selected regions of the substrate prior to the formation of the epitaxial layer 14. This up-diffusion will then meet with the down-diffusion of the implanted boron resulting in an increased depth of isolation. For a transistor structure, it is important that the lateral diffusion of the boron implanted into the isolation grooves is small so that the boron remains well separated from the base region of the transistor to be formed later. The lateral diffusion occurs at a substantially lower rate than the downward diffusion thereby inherently facilitating the separation of the isolation boron from the base region of the transistor to be formed. This condition is achieved by the phenomenon of oxidation enhancement of diffusivity which, up to a temperature of about 1000° C., causes the boron to diffuse sufficiently faster under an area where the oxide is grown, particularly in the <100> crystallographic direction. The silicon nitride layer 20 (FIG. 4) is then stripped using any conventional technique and is replaced with a 2000Å thick layer 38 of silicon dioxide, here such layer being grown in steam at 1000° C. for approximately 35 minutes. The resulting structure with a layer 38 of silicon dioxide formed thereon is now in the order of 2500Å thick, as shown in FIG. 5.

Figure 6:
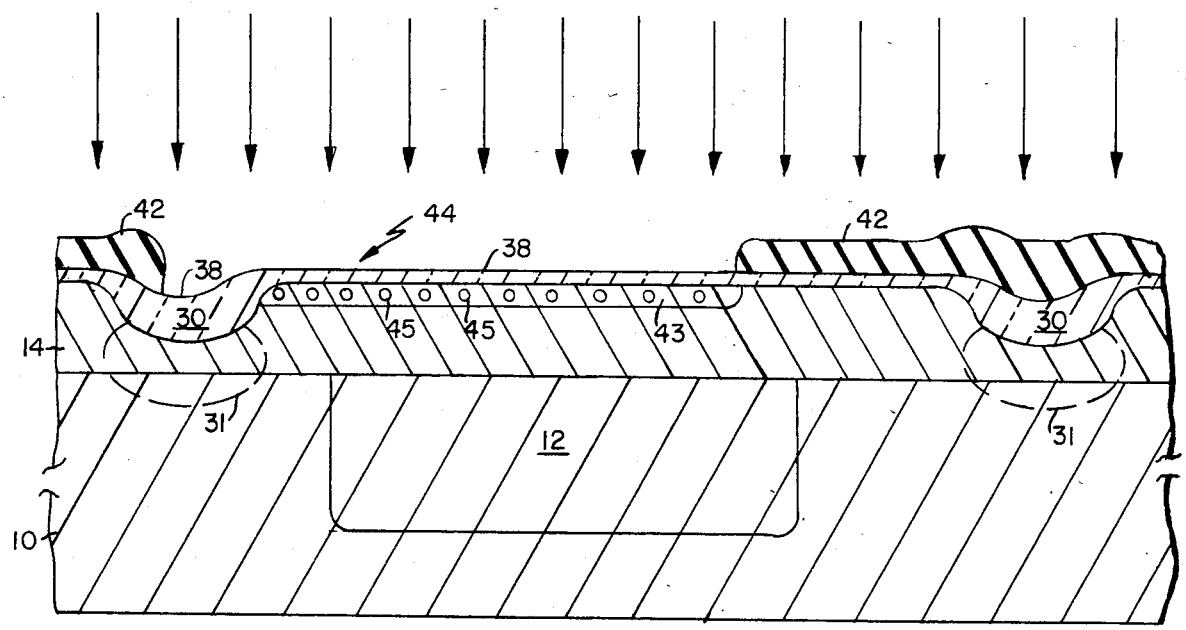

Referring now to FIG. 6, a photoresist mask from a layer 42 of photoresist is formed over the surface of the structure using conventional photolithography to provide a window 44 to expose the base region. Using this mask, boron particles 45 are ion implanted through the silicon dioxide layer 38 into the base region using a dosage, here as follows: $8 \times 10^{13}/cm^2$ at 100 Kev. The photoresist layer 42 is then removed, using any conventional process. The structure is then annealed in argon at 1100° C. for 10 minutes so that the base region spreads because of diffusion of the boron dopant to a depth in the order of 3000Å to form the inactive base region 43 (i.e. the base region used to electrically interconnect the active base region to the base electrode, as will be discussed).

Figure 7:
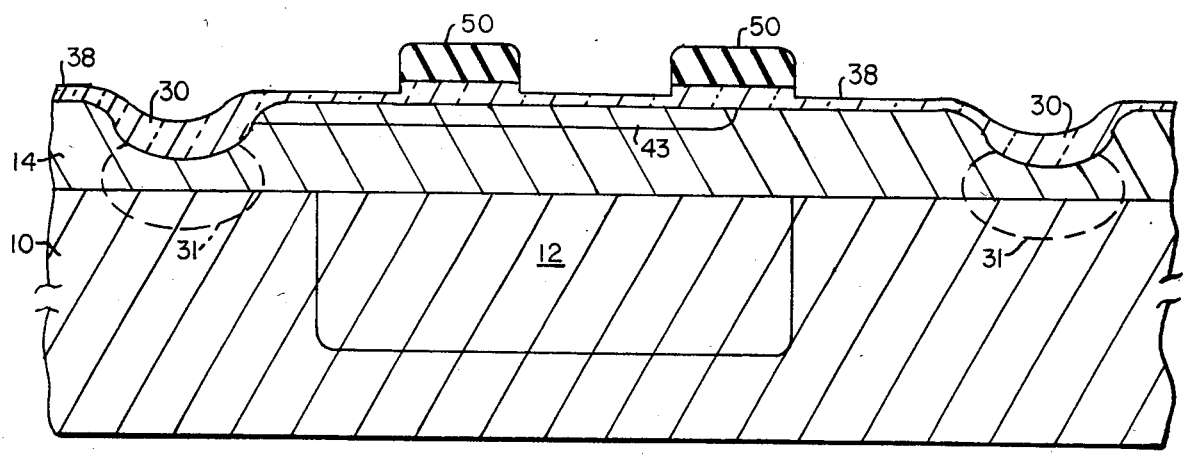

Referring now to FIG. 7, a layer 50 of photoresist is again applied to the surface of the structure and formed into a mask, as shown, using conventional photolithographic techniques. The photoresist mask is formed to expose all contact openings (emitter, base and collector) simultaneously. Using this photoresist mask, portions of the silicon dioxide layer 38 (and a similar upper layer portion of the silicon dioxide in the isolation grooves) are removed to a thickness in the order of 500 to 1000Å, as shown. Alternatively, the silicon dioxide layer 38 may be etched through to the epitaxial layer in the contact areas unmasked by the photoresist and replaced with a freshly grown silicon dioxide layer in the order of 500Å thick. (This thin silicon dioxide layer acts as a stress absorbing pad as well as an etch stop if a silicon nitride layer, to be deposited in the next step, is subsequently etched in a plasma etcher.)

Figure 9A:
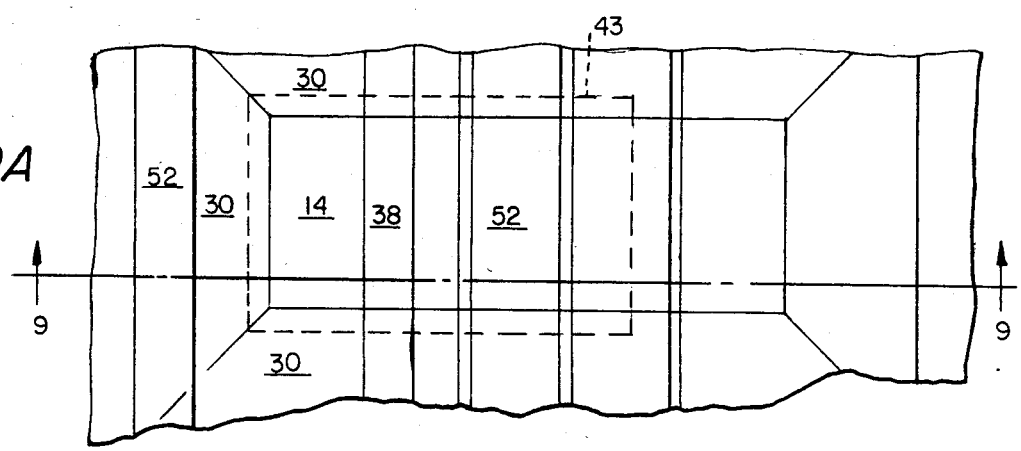
FIGS. 9A and 9B are plan and isometric views, respectively, of the bipolar transistor at one step in the fabrication thereof, FIG. 9 being a cross-sectional elevation view taken along line 9—9 of FIG. 9A.
Figure 8:
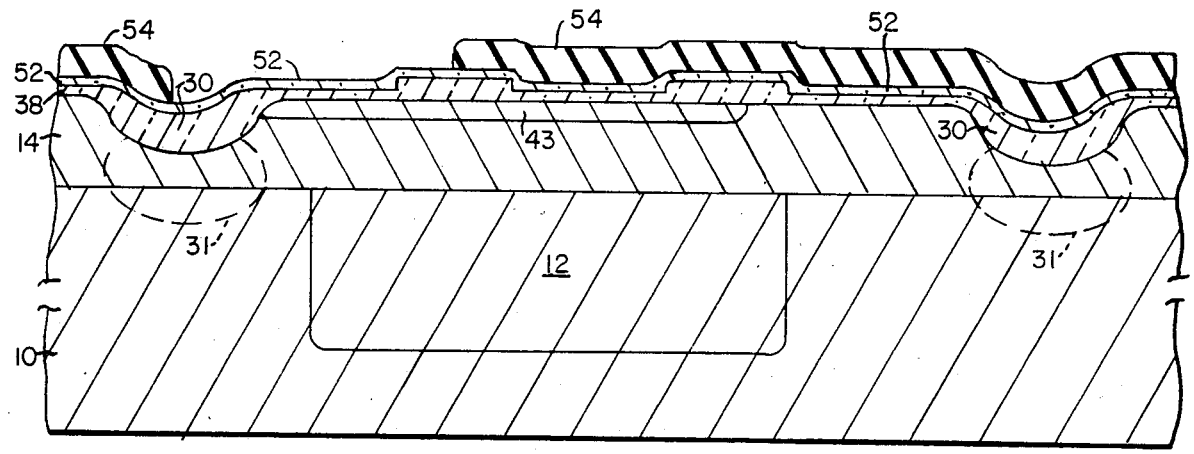
Figure 9:
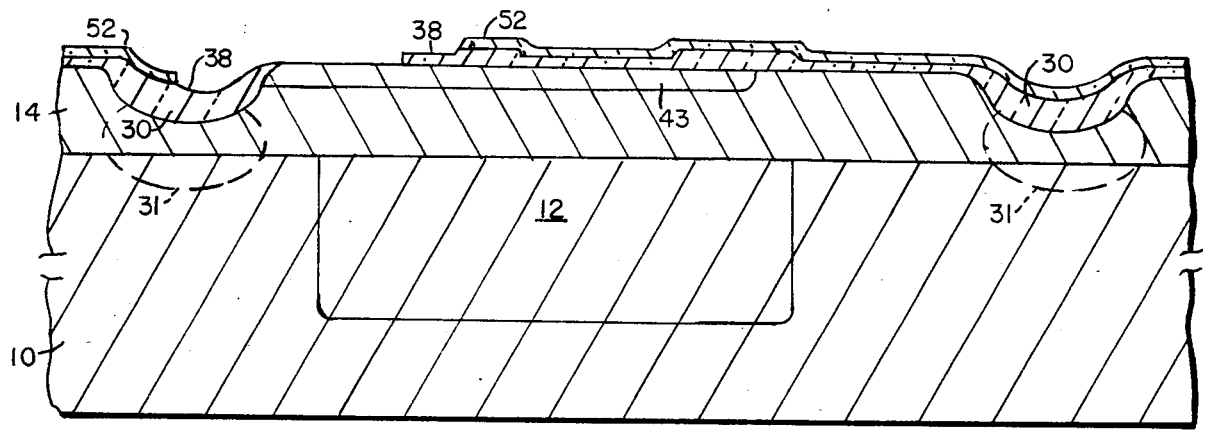
Figure 9B:
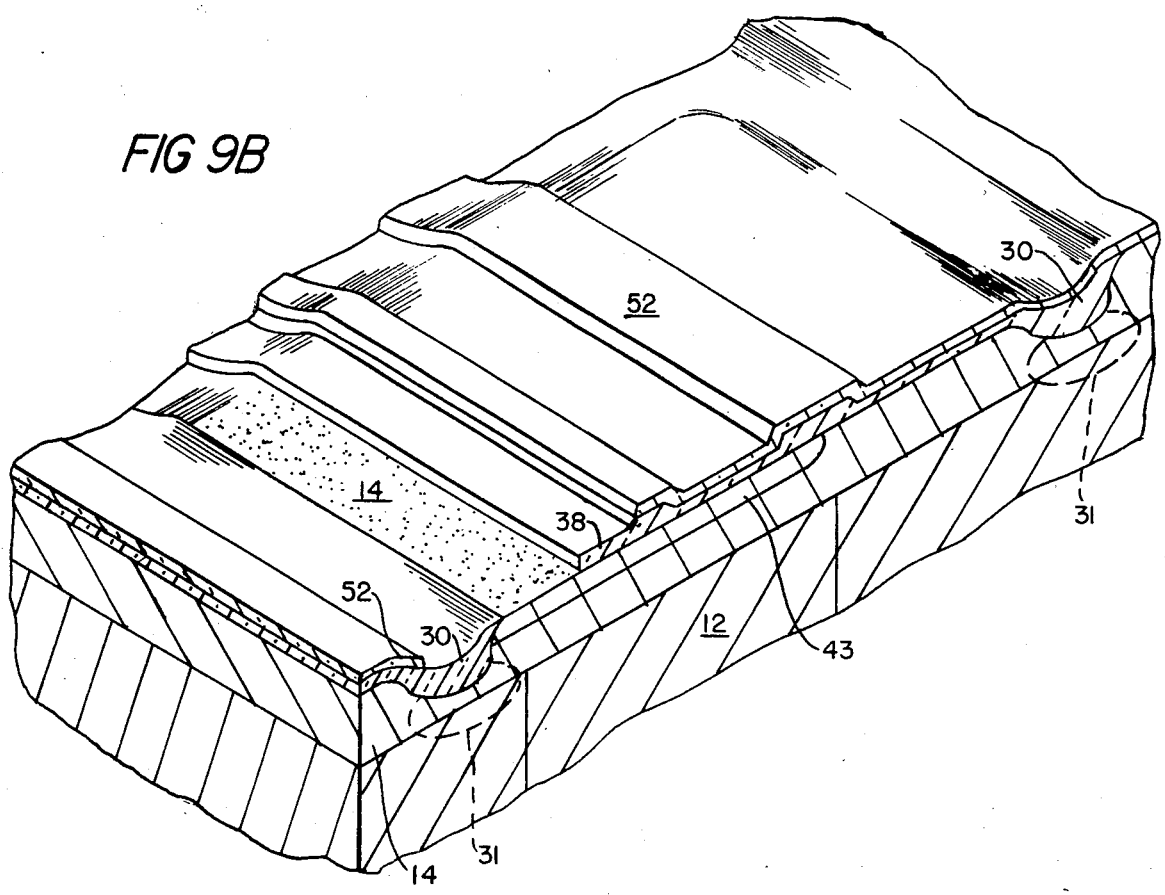

Referring now to FIG. 8, the photoresist layer 50 is removed and a layer 52 of silicon nitride is here chemically vapor deposited to a thickness of 1000 to 1500Å. A photoresist layer 54 is then deposited over the silicon nitride layer 52 and formed into a mask, as shown, using conventional photolithographic techniques. This non-critical oversized mask is used to selectively remove the exposed portions of the silicon nitride layer 52 by conventional plasma etching and the then exposed underlying thin silicon dioxide layer 38 from the emitter area using conventional wet chemical etching processes, as shown in FIG. 8, to form the structure shown in FIGS. 9, 9A and 9B after the photoresist layer 54 is removed.

Figure 10A:
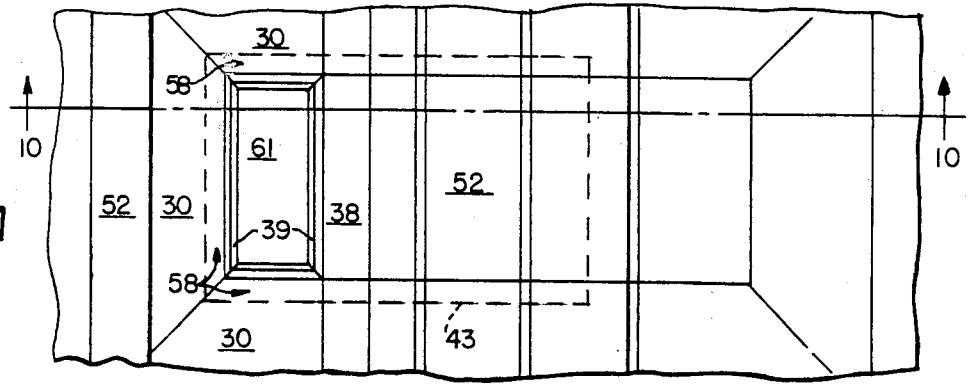
FIGS. 10A and 10B are plan and isometric views, respectively, of the bipolar transistor at one step in the fabrication thereof, FIG. 10 being a cross-sectional elevation view taken along line 10—10 of FIG. 10A.
Figure 10B:
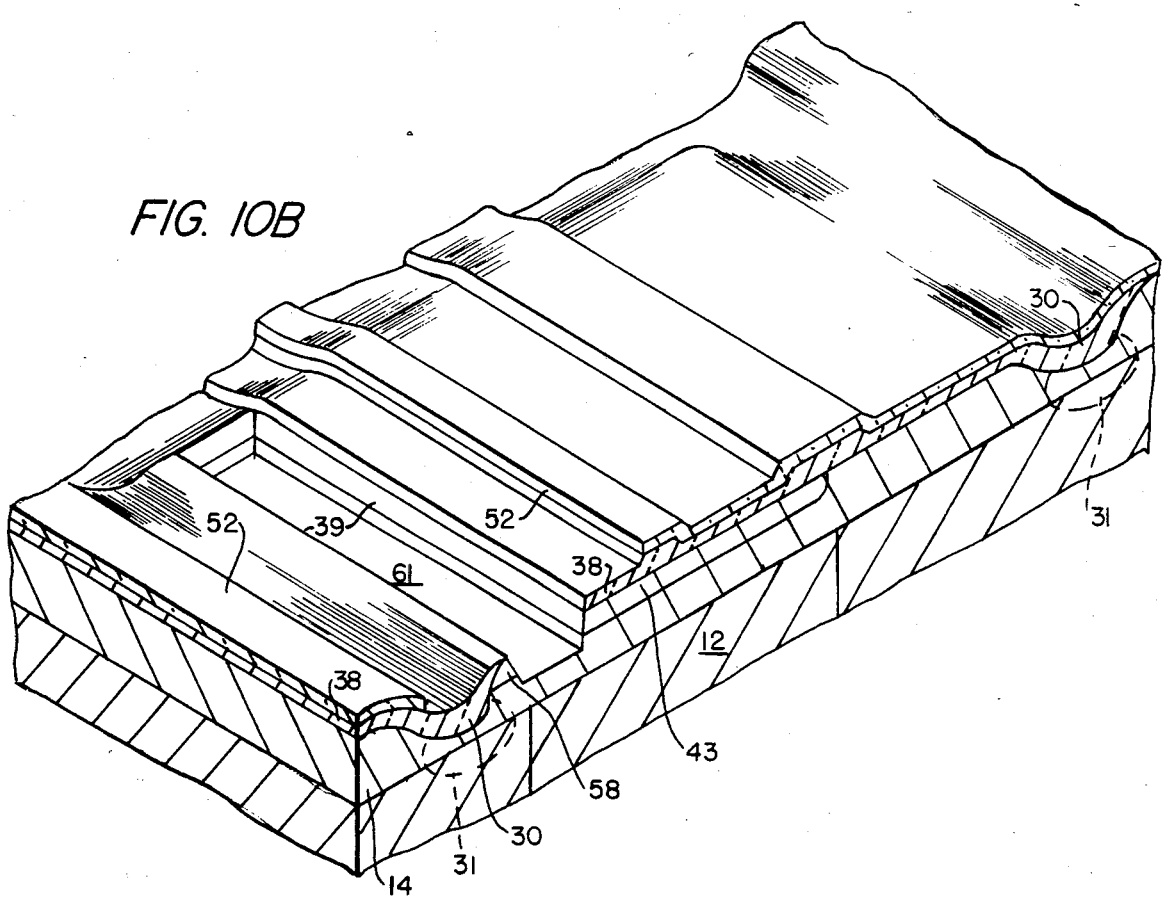
Figure 10:
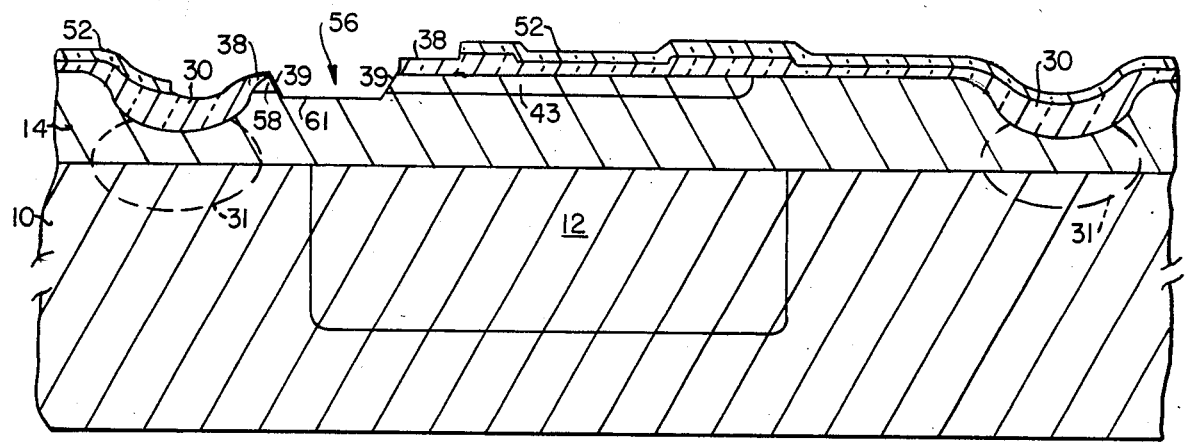
Figure 11:
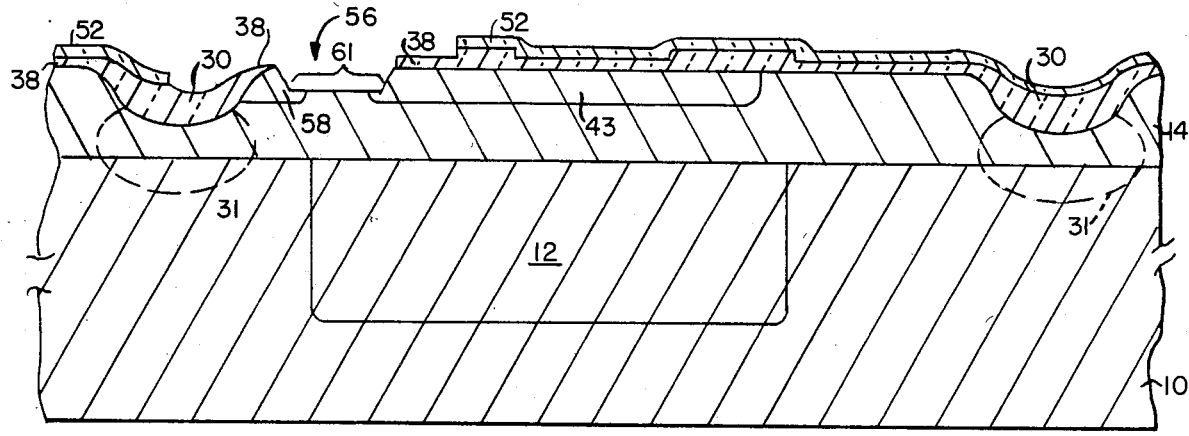

The surface of the structure is brought into contact with a suitable anisotropic etch, here potassium hydroxide solution, to selectively remove the exposed portions of the silicon epitaxial layer 14 as shown in FIGS. 10, 10A and 10B. In particular, it should be noted that the anisotropic etch is brought into contact with the <100> surface of the epitaxial layer 14 along the <110> direction so that the side walls 39 of the depression 56 are converging and are parallel to the <111> crystallographic plane of the silicon epitaxial layer 14 and such anisotropic etch does not undercut the emitter contact opening but leaves a generally triangularly-shaped region 58, as shown, between the depression 56 and the isolation groove 30. It is also noted that the anisotropic etch removes the portions of the inactive doped base region 43 of the epitaxial layer 14, as shown. As a result, the triangularly-shaped portion 58 of the inactive base region 43 is retained between the emitter opening, i.e., depression or groove 56, and the silicon dioxide filled isolation groove 30, as shown. Region 58 prevents inversion from electrically short-circuiting between the emitter and collector regions of the transistor to be formed. Without the boron doped region 58, positive charges residing in the silicon dioxide isolation groove 30 (or charges induced in the silicon by subsequent metallization formed over such silicon dioxide in a manner to be described hereinafter) can cause inversion at the silicon-silicon dioxide interface and thus cause an emitter-collector electrical short circuit by channeling. After the anisotropic etching, the structure is heated in argon to 1100° C. for about 20 minutes in order to drive the inactive base region 43 deeper by in the order of 3000Å so that it extends to a level slightly below the bottom 61 of the etched depression 56 as shown in FIG. 11, i.e. the bottom of the depressed emitter contact opening.

Figure 12:
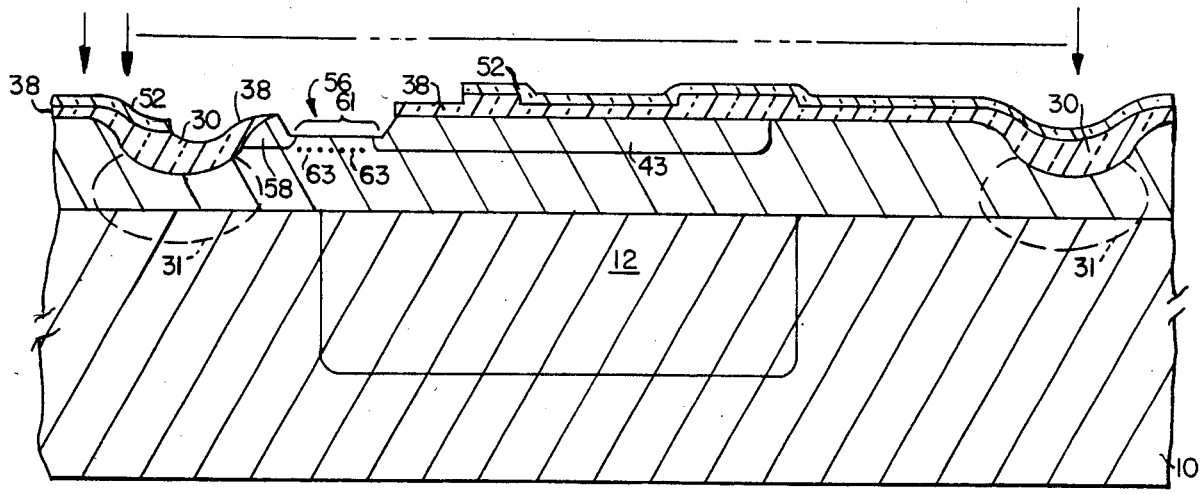
Figure 14:
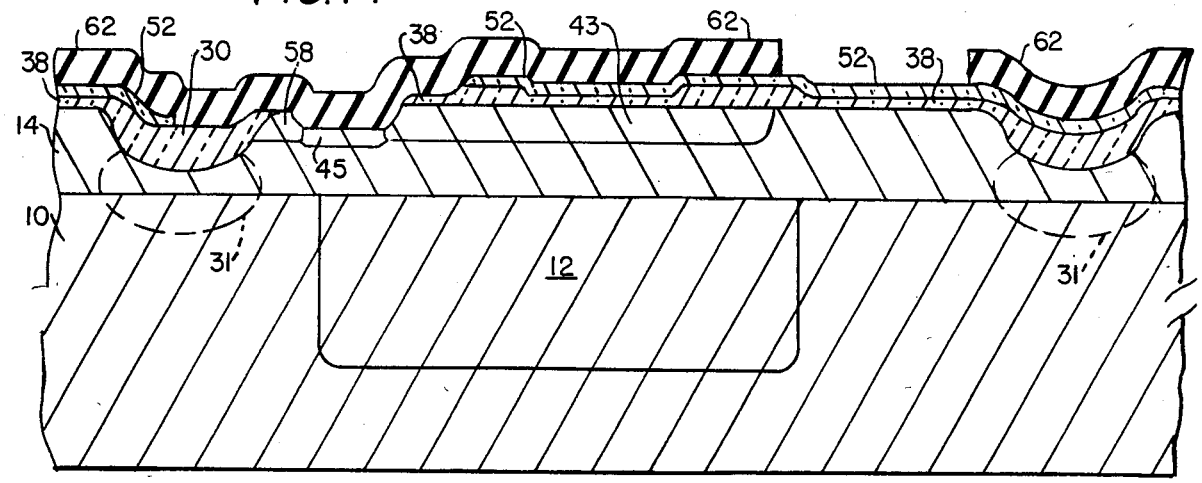
Figure 13:
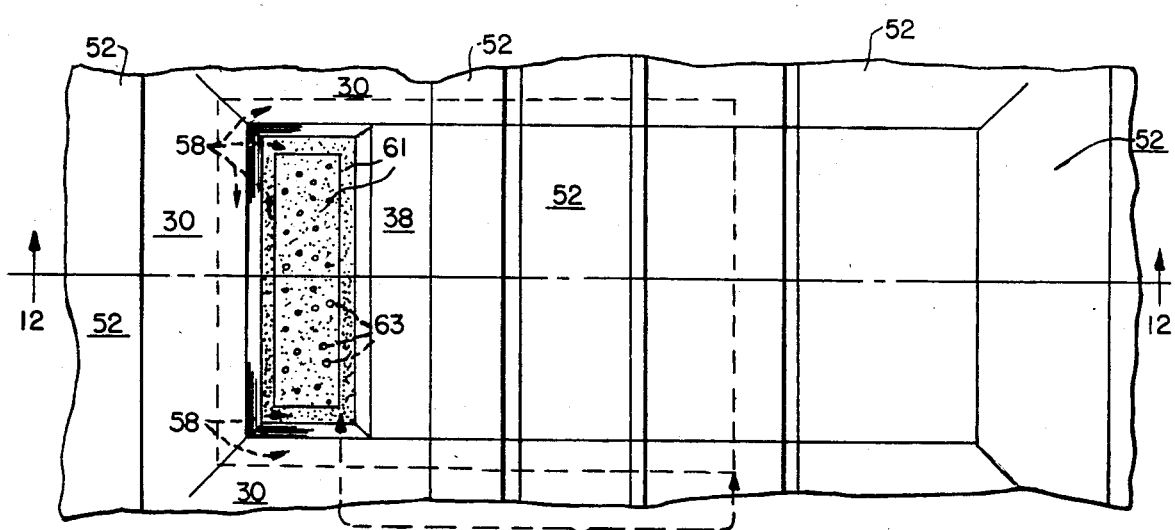
FIG. 13 is a plan view of the bipolar transistor at one step in the fabrication thereof, FIG. 12 being a cross-sectional elevation view taken along line 12—12 of FIG. 13.

Next, the active base region is formed by implanting boron ions through the emitter contact opening (i.e. depression 56) with a dosage ranging from $7 \times 10^{12}/cm^2$ to $1 \times 10^{13}/cm^2$, depending on the beta of the transistor desired, as shown in FIGS. 12 and 13. The implant is made in two steps, namely at 40 Kev and 100 Kev. If desired, a thin oxide layer (not shown) in the order of 300 to 500Å thick may be grown or deposited on the emitter contact opening before the implant to act as a shield for undesired impurities. The structure is then heated in an argon atmosphere at 1000° C. for 20 minutes to anneal and activate the boron ions and thereby form the active base region 45 (FIG. 14). Further, the base region 43 is driven slightly further into the epitaxial layer 14 during this step.

Referring to FIG. 14, a photoresist layer 62 is deposited over the surface of the structure to form a relatively non-critical, oversized mask, as shown, to enable a selected portion of the silicon nitride layer 52 and thinned silicon dioxide layer 38 to be removed from the collector contact area, as shown, using any conventional etching technique.

Figure 15:
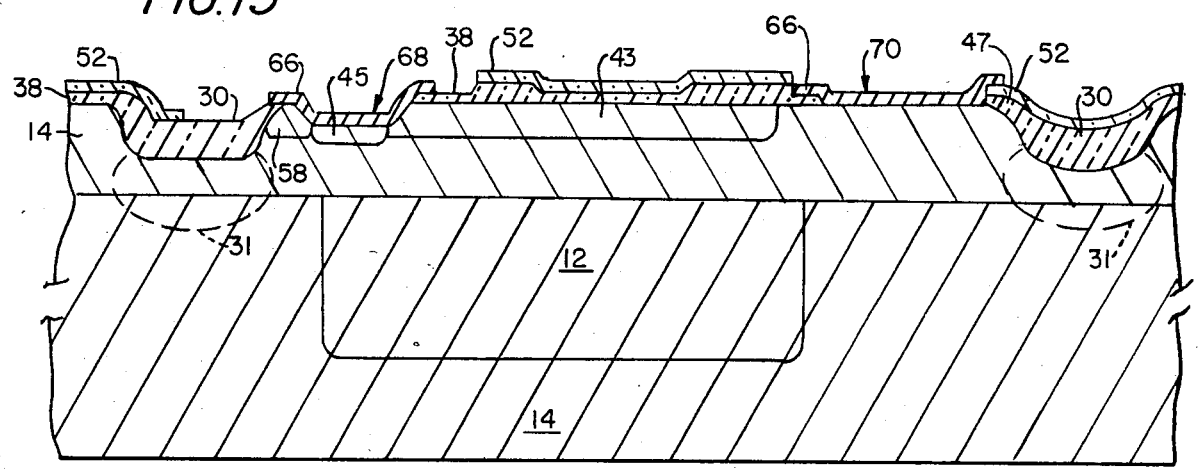

Referring now to FIG. 15, a layer 66 of polycrystalline silicon is deposited, here by chemical vapor deposition (using cracking of SiH4 at 600° to 700° C.), onto the surface of the structure to a thickness in the order of 2000 to 3000Å. The deposited polycrystalline silicon layer 66 is then doped with a suitable dopant, here phosphorous, by conventional diffusion at 900° to 950° C. (Alternatively, the deposited polycrystalline silicon layer 66 may be doped by ion implantation of phosphorous or arsenic.) The temperature cycle involved in the diffusion is no longer than 20 to 25 minutes so that the diffusion into the single crystal epitaxial layer will be very shallow (less than 1000Å), especially because the diffusion in the polycrystalline silicon layer 66 is much more rapid than in single crystal silicon. Using an oversized photoresist mask (not shown), the doped polycrystalline layer 66 is etched into emitter and collector contacts 68, 70, respectively, as shown in FIG. 15. An emitter-base junction is thus formed between the emitter contact 68 and the lightly doped, active base region 45. Note that it is desirable that the doped polycrystalline silicon emitter contact 68 extends slightly beyond the periphery of the emitter opening in order to protect the emitter-base junction.

Figure 16:
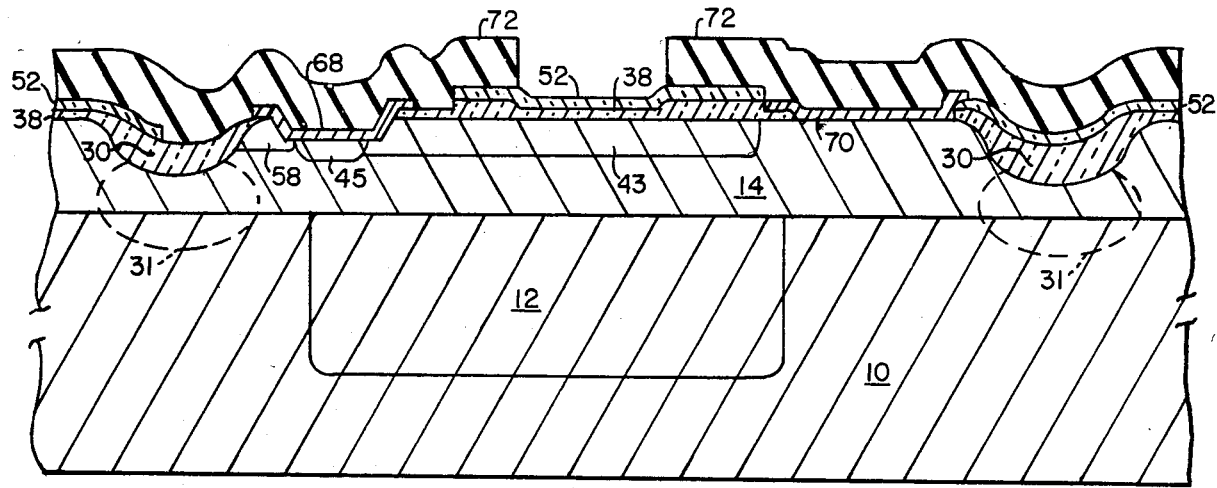
Figure 17:
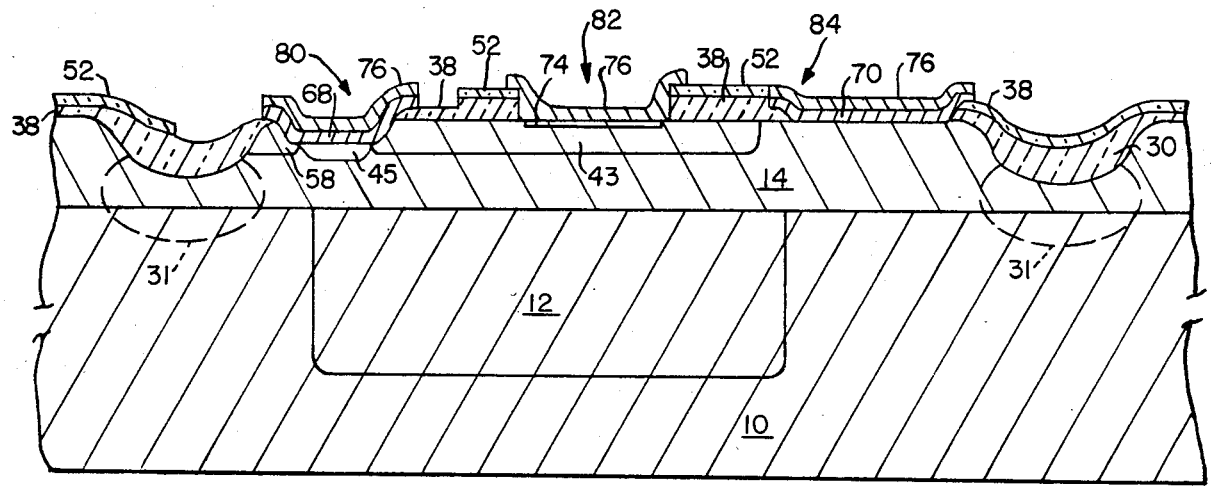

Referring now to FIG. 16, a layer 72 of photoresist is patterned, as shown, to form a mask which exposes the region where the base contact is to be formed. The exposed portions of the silicon nitride layer 52 and thinned silicon dioxide layer 38 are etched, using any conventional technique. Next, a layer of platinum is deposited by sputtering and selectively lifted off by dissolving photoresist layer 72, except from the base contact area as shown in FIG. 17. The remaining platinum is then sintered in the base contact area to form a region 74 of PtSi as shown in FIG. 17 and the excess platinum is then removed by etching in aqua regia. Alternatively, the PtSi may be omitted if such is not needed for the base contact. The process described may be easily modified to form PtSi simultaneously on the base contact and on portions of the collector region, as by extending the base contact window to expose portions of the adjacent collector regions to obtain a Schottky contact.

A metallization layer 76, preferably aluminum, 5000 to 7000Å thick, is deposited over the surface of the structure and patterned into conductors (i.e. emitter, base and collector contacts 80, 82, 84, respectively), as shown in FIG. 17. Note that the oversized polycrystalline silicon emitter 68 protects the emitter junction from being shorted by the aluminum and from alloying spikes which can form in single crystal silicon in specific crystallographic orientations. It is also noted that the active base region 45 is electrically coupled to the base contact 82 through the more heavily doped inactive base region 43. It follows then that the term "active base region" refers to the p-type conductivity region which interacts with the emitter contact 68 and the term "inactive base region" refers to the p-type conductivity region which is used to electrically interconnect the active base region to the base contact 82.

Having described preferred embodiments of this invention, it is now evident that other embodiments incorporating these concepts may be used. For example, while the invention has been described for forming isolation regions for bipolar transistors, such method may be used to provide isolated regions for other devices, such as MOS transistors. It is felt, therefore, that this invention should not be restricted to the disclosed embodiments, but rather should be limited only by the spirit and scope of the appended claims.

What is claimed is:

1. A method for forming a semiconductor structure comprising the step of:
    (a) forming a mask comprising upper and lower layers of different materials over a surface of a semiconductor with a first window in the lower layer and a second, smaller, window in the upper layer, edge portions of the second window overhanging edge portions of the first window a length greater than the thickness of the lower layer;
    (b) forming a depression in the portion of the semiconductor disposed beneath the first window with side wall portions masked by the overhanging edge portions of the second window; and
    (c) ion implanting particles into a region of the semiconductor disposed beneath the depression exposed by the second window and unmasked by the edge portions of the second window.

2. A method for forming a semiconductor structure comprising the steps of:
    (a) forming a mask comprising upper and lower layers of different material over a surface of a semiconductor with a first window in such lower layer exposing a portion of the surface of the semiconductor and a smaller, second window in the upper layer having extended peripheral portions masking peripheral portions of the exposed surface portion of the semiconductor, the length of each extended peripheral portion of the upper layer being greater than the thickness of the lower layer;

(b) bringing an etchant into contact with the exposed surface portion of the semiconductor forming a depression in such semiconductor with side wall portions masked by the extended peripheral portions of the second window; and (c) ion implanting particles into a region of the semiconductor below the depression exposed by the second window and unmasked by the peripheral portions of the second window.

3. A method for forming a semiconductor structure comprising the steps of:

(a) forming a first layer of a first material over a surface of a semiconductor;

(b) forming a second layer of a second, different material over the first layer;

(c) forming a first window in a portion of the second layer and exposing portions of the first layer;

(d) bringing a chemical etchant into contact with the exposed edge portions of the first layer to selectively etch the portions of the first layer providing a second window in the first layer larger than the first window, peripheral portions of the second window extending over the first window an amount greater than the thickness of the first layer and wherein the first window exposes a portion of the surface of the semiconductor and with edge portions of the second window overhanging peripheral portions of the exposed portion of the semiconductor;

(e) bringing an etchant into contact with the portion of the semiconductor exposed by the second window forming a depression in the semiconductor with side wall portions and a bottom portion, the extended peripheral portions of the first window overhanging such side wall portions to mask such side wall portions;

(f) ion implanting particles into a region disposed at the bottom portion of the depression with the extended peripheral portions of the first window masking the side wall portions of such depression preventing ion implantation of such particles into the side wall portions of such depression.

4. The method recited in either one of claims 1, 2 or 3 including the step of forming an insulating material in the formed depression subsequent to the ion implantation step.

5. A method for forming a semiconductor structure comprising the step of:

(a) providing a substrate;

(b) forming an epitaxial layer of semiconductor material on the substrate;

(c) forming a mask comprising upper and lower layers of different materials over a surface of the epitaxial layer with a first window in the lower layer and a second, smaller window in the upper layer, edge portions of the second window overhanging edge portions of the first window a length greater than the thickness of the lower layer;

(d) forming a depression in the portion of the epitaxial layer disposed beneath the first window with side wall portions masked by the overhanging edge portions of the second window; and (e) ion implanting particles into a region of the epitaxial layer disposed beneath the depression exposed by the second window and unmasked by the edge portions of the second window.

6. A method for forming a semiconductor structure comprising the steps of:

(a) providing a substrate;

(b) forming an epitaxial layer of semiconductor material on the substrate;

(c) forming a mask comprising upper and lower layers of different material over a surface of the epitaxial layer with a first window in such lower layer exposing a portion of the surface of the semiconductor and a smaller, second window in the upper layer having extended peripheral portions masking peripheral portions of the exposed surface portion of the semiconductor, the length of each extended peripheral portion of the upper layer being greater than the thickness of the lower layer;

(d) bringing an etchant into contact with the exposed surface portion of the epitaxial layer forming a depression in such semiconductor with side wall portions masked by the extended peripheral portions of the second window; and (e) ion implanting particles into a region of the epitaxial layer below the depression exposed by the second window and unmasked by the peripheral portions of the second window.

7. A method for forming a semiconductor structure comprising the steps of:

(a) providing a substrate;

(b) forming an epitaxial layer of semiconductor material on the substrate;

(c) forming a first layer of a first material over a surface of a the epitaxial layer;

(d) forming a second layer of a second, different material over the first layer;

(e) forming a first window in a portion of the second layer and exposing portions of the first layer;

(f) bringing a chemical etchant into contact with the exposed portions of the first layer to selectively etch the portions of the first layer providing a first window in the first layer larger than the second window, peripheral portions of the second window extending over the first window an amount greater than the thickness of the first layer and wherein the second window exposes a portion of the surface of the epitaxial layer and with edge portions of the first window overhanging peripheral portions of the exposed portion of the epitaxial layer;

(g) bringing an etchant into contact with the portion of the epitaxial layer exposed by the second window forming a depression in the epitaxial layer with side wall portions and a bottom portion, the extended peripheral portions of the first window overhanging such side wall portions to mask such side wall portions;

(h) ion implanting particles into a region disposed at the bottom portion of the depression formed in the epitaxial layer with the extended peripheral portions of the first window masking the side wall portions of such depression preventing ion implantation of such particles into the side wall portions of such depression.

8. The method recited in either one of claims 5, 6 or 7 including the step of forming an insulating material in the formed depression subsequent to the ion implantation step.

* * * * *